US009524966B2

(12) United States Patent
Kaindl et al.

(10) Patent No.: US 9,524,966 B2
(45) Date of Patent: Dec. 20, 2016

(54) SEMICONDUCTOR DEVICE (71) Applicant: Infineon Technologies Austria AG, Villach (AT)

(72) Inventors: Winfried Kaindl, Unterhaching (DE); Franz Hirler, Isen (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/527,831

(22) Filed: Oct. 30, 2014

(65) Prior Publication Data

US 2015/0115354 A1 Apr. 30, 2015

(30) Foreign Application Priority Data

Oct. 30, 2013 (CN) ............... 2013 2 0675451 U (51) Int. Cl.
*H01L 27/088* (2006.01)
*H01L 29/06* (2006.01)
*H01L 29/423* (2006.01)
*H01L 29/78* (2006.01)
*H01L 29/08* (2006.01)
*H01L 29/10* (2006.01)

(52) U.S. Cl.
CPC ......... *H01L 27/088* (2013.01); *H01L 29/0634* (2013.01); *H01L 29/0878* (2013.01); *H01L 29/4238* (2013.01); *H01L 29/7802* (2013.01); *H01L 29/7813* (2013.01); *H01L 29/1095* (2013.01)

(58) Field of Classification Search
CPC ............ H01L 27/088; H01L 29/0634; H01L 29/0696; H01L 29/4236; H01L 29/42372; H01L 29/45; H01L 29/4916; H01L 29/495; H01L 29/7827

USPC ......................................... 257/330
See application file for complete search history.

(56) References Cited

U.S. PATENT DOCUMENTS

2003/0052329 A1* 3/2003 Kobayashi .......... H01L 29/0619
257/135
2011/0278671 A1* 11/2011 Lin ................... H01L 29/41725
257/337
2012/0273916 A1* 11/2012 Yedinak ................. H01L 29/74
257/471

OTHER PUBLICATIONS

Tam, Wing-Shan, et al. "Off-state drain breakdown mechanisms of VDMOS with anti-JFET implantation." Microelectronics Reliability 51.12 (2011): 2064-2068.*

* cited by examiner

*Primary Examiner* — Fernando L Toledo
*Assistant Examiner* — Adam S Bowen
(74) *Attorney, Agent, or Firm* — Eschweiler & Associates, LLC (57) ABSTRACT

The present disclosure provides a semiconductor device, which includes a compensation area which includes p-regions and n-regions, and a plurality of transistor cells on the compensation area. Each of the plurality of transistor cells includes a source region, a body region, a gate and an interlayer dielectric, and a source metallization layer arranged on the interlayer dielectric. The semiconductor device further includes an additional n-doping region that is provided on top of the n-regions between two neighboring body regions, and a source plug which fills a contact hole formed through the interlayer dielectric between the source and body region and the source metallization layer, so as to electrically connect the source and body region and the source metallization layer.

14 Claims, 5 Drawing Sheets

SEMICONDUCTOR DEVICE

CROSS REFERENCE TO RELATED APPLICATION

This application claims priority to Chinese Patent Application serial number 201320675451.6 filed on Oct. 30, 2013 and is hereby incorporated in its entirety.

FIELD

This disclosure relates to a semiconductor device, in particular, to a super-junction device.

BACKGROUND

A lot of technologies use narrow poly-silicon stripes as a controlling gate to switch the current between source and drain of a MOSFET. As the area of the gate poly silicon dominantly determines the gate charge, it may be desirable in one embodiment to have small stripes as this allows low gate driving losses, low delay times, and, therefore, a high efficiency in applications. However, especially when using very small stripes the effective resistance of these stripes and, therefore, the effective gate resistance of the device get comparably high. The effective gate resistance which is a function of the poly silicon sheet resistance depends on the doping level of the poly silicon which is limited by the solubility of the doping material. The thickness of the gate poly-silicon layer cannot be increased by any order, as a too big thickness would lead to an undesired high topology which would make the process much more complex. Therefore the sheet resistance of an n-doped poly silicon layer of 600 nm thickness cannot be considerable lower than 8-10 ohm/sq. A high effective gate resistance leads to increased switching losses and to undesired inhomogeneous switching across the chip which might end-up in oscillations or in reduced device ruggedness in worst-case.

Another drawback of the small width of the poly silicon stripes is an increased on-resistance because of the JFET effect. Between two opposite p-bodies, a depletion region builds-up during the on-state of the device which is narrowing the current path and, therefore, increases the on-state resistance ($R_{dson}$). This is the so-called JFET effect. It is obvious that this effect is more pronounced with a small width of the poly silicon stripes as the p-bodies are usually implanted by using the poly-silicon openings as a mask.

Figure 1:
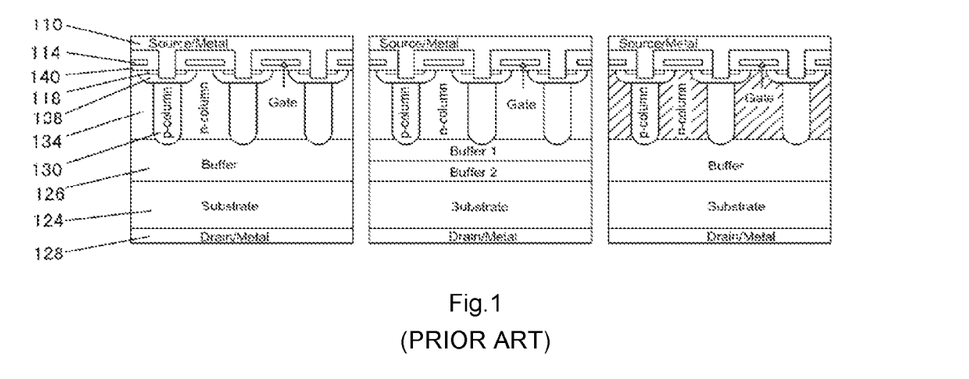
FIG. 1 schematically shows a cross section of a conventional super-junction structure.

FIG. 1 shows a conventional super-junction structure for explanation purposes. The device as shown in FIG. 1 has a semiconductor body with a compensation area comprising p-regions (p-columns) 130 and n-regions (n-columns) 134. The compensation region is connected to a MOS transistor cell comprising a source region 118, a body region 138 and a controlling gate 114. An insulating structure 140, electrically isolates the gate 114 from the body region 138, the source region 118, the n-regions (n-columns) 134 and a metallization layer 110. And a part of the insulating structure 140 may act as gate insulating layer. The drain 128 of the transistor is connected to a highly doped substrate 124. Between the substrate and the compensation area a buffer layer 126 is located. The source contacts are electrically connected by the metallization layer 110. The drain contact is built at the device backside and is covered with metallization 128.

Modern super-junction devices are featuring lower and lower pitch sizes. This trend is driven either by the reduction of $E_{oss}$ which allows lower switching losses, and, even more, by the reduction of the on-resistance ($R_{dson}$) per chip area. On the one hand, a low $R_{dson}$ per chip area is the major lever to reduce chip costs, and, on the other hand, it allows to provide lower $R_{dson}$ values for a given package size.

A reduction of the $R_{dson}$ per chip area automatically leads to narrower contact-holes for the source contact. Voidless filling of such narrow contact-holes with metal is nearly impossible. Therefore usually a plug process (e.g. Poly-silicon or Wolfram) is used. Today only a plug-process solely or an Anti-JFET implant solely are used.

SUMMARY

In one embodiment of the present disclosure, a semiconductor device is provided, which comprises a compensation area which comprises p-regions and n-regions, and a plurality of transistor cells on the compensation area, each of the plurality of transistor cells comprising a source region, a body region, a gate and an interlayer dielectric. The semiconductor device further comprises a source metallization layer arranged on the interlayer dielectric, and an additional n-doping region that is provided on top of the n-regions between two neighboring body regions. Further, a source plug fills a contact hole formed through the interlayer dielectric between the source and body region and the source metallization layer, so as to electrically connect the source and body region and the source metallization layer.

In some embodiments, the doping concentration of the additional n-doping region is $0.5 \times 10^{16}$ cm$^{-3}$~$5 \times 10^{16}$ cm$^{-3}$.

In some embodiments, the gate is formed of poly-silicon stripe.

In some embodiments, the semiconductor device further comprises one or more gate fingers which are oriented perpendicular to the gates, each of the gate fingers electrically connecting two neighboring gates.

In some embodiments, each of the gate fingers is formed of a continuous stripe.

In some embodiments, each of the gate fingers is formed of a non-continuous stripe.

In some embodiments, that, the gate finger is formed of metal or poly-silicon.

In some embodiments, the semiconductor device further comprises one or more intermitting gate fingers which interrupt the source metallization layer so as to insulate the source metallization layer and the gates of the transistor cells, the intermitting gate fingers being oriented perpendicular to the gates.

In some embodiments, the semiconductor device further comprise one or more continuous gate fingers which interrupt the source metallization layer so as to insulate the source metallization layer and the gates of the transistor cells, the continuous gate fingers being oriented perpendicular to the gates.

In some embodiments, that, the intermitting gate finger is formed of poly-silicon and metal.

In some embodiments, the width of the stripe of the gate formed in poly-silicon is equal to or narrower than 8 μm.

In some embodiments, the semiconductor device further comprises a surrounding gate ring, and the one or more gate fingers are connected to the surrounding gate ring.

In some embodiments, the width of the gate finger is 10-50 μm.

In some embodiments, the source plug is formed of polysilicon or Wolfram.

In some embodiments, the width of the source plug is less than 2 μm.

In some embodiments, the gates have a planar structure.

In some embodiments, the gates are located at least partially in trenches.

In some embodiments, the semiconductor device is a super-junction device.

BRIEF DESCRIPTION OF THE DRAWINGS

These and other features and advantages of the present disclosure will be apparent from the following detailed description with reference to the accompanying drawings, in which.

DETAILED DESCRIPTION

Embodiments of the present disclosure now will be described more fully hereinafter with reference to the accompanying drawings, in which embodiments of the disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like elements throughout. Furthermore, the various layers and regions illustrated in the figures are illustrated schematically and are not necessarily drawn to scale. Accordingly, the present disclosure is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer.

Moreover, the terms "first conductivity type" and "second conductivity type" refer to opposite conductivity types such as N or P-type, however, each embodiment described and illustrated herein includes its complementary embodiment as well.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.)

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The present disclosure proposes a semiconductor device structure that can cope with the two major drawbacks (i.e., increased on-resistance due to the JFET effect and increased gate resistance) that arise due to the design of a controlling gate with narrow stripes of poly silicon. For the sake of simplicity, the following embodiments use a super-junction structure as example for explanation.

Figure 2:
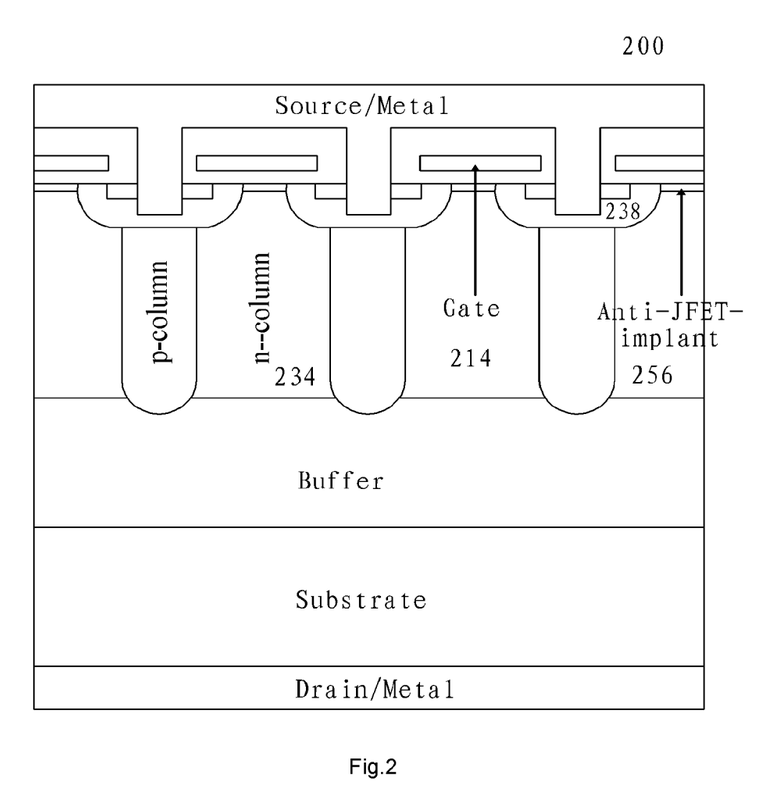
FIG. 2 schematically shows a cross section of a super-junction structure with a gate formed of poly silicon stripes and an additional Anti-JFET-implant between two adjacent p-body regions according to the present disclosure.

FIG. 2 is a sketch of a super-junction structure 200 according to one embodiment of the present disclosure.

The super-junction structure 200 shown in FIG. 2 is substantially the same as the conventional super-junction structure shown in FIG. 1, except for the additional Anti-JFET-implant region 256 between two adjacent p-body regions 238. For the sake of simplicity, descriptions of the parts of FIG. 2 that are the same as FIG. 1 are omitted.

During the on-state of the MOS transistor cell, the p-body regions 238 are connected to the source potential with the current flowing along the n-column 234. Between the p-body region 238 and the conductive n-column 234, a voltage drop develops. Consequently, between two opposite p-body regions 238 a depletion region builds-up which is narrowing the current path and, therefore, increases the on-state resistance ($R_{dson}$). This is the so-called JFET effect. It is obvious that this effect is more pronounced with a decreased size of the pitch between the MOS transistor cells. In order to improve the $R_{dson}$, an additional n-doping is implanted on top of the Si layer (i.e., the n-column 234) between two neighboring body regions, and such n-doping implant is referred to as Anti-JFET-implant. After the Anti-JFET-implant, an Anti-JFET region 256 is formed between two adjacent p-body regions 238.

A high concentration of the Anti-JFET region 256 can reduce the on-resistance of the super-junction structure. However, the doping level of the Anti-JFET-implant needs to be well balanced as a too high level would increase the gate charge of the super-junction structure and sacrifice the short-circuit ruggedness. In an embodiment according to the present disclosure, the concentration of the Anti-JFET region 256 is $0.5 \times 10^{16}$ cm$^{-3}$~$5 \times 10^{16}$ cm$^{-3}$.

In an embodiment, the gate 214 is formed of poly silicon stripes, as shown in FIG. 2.

Figure 3:
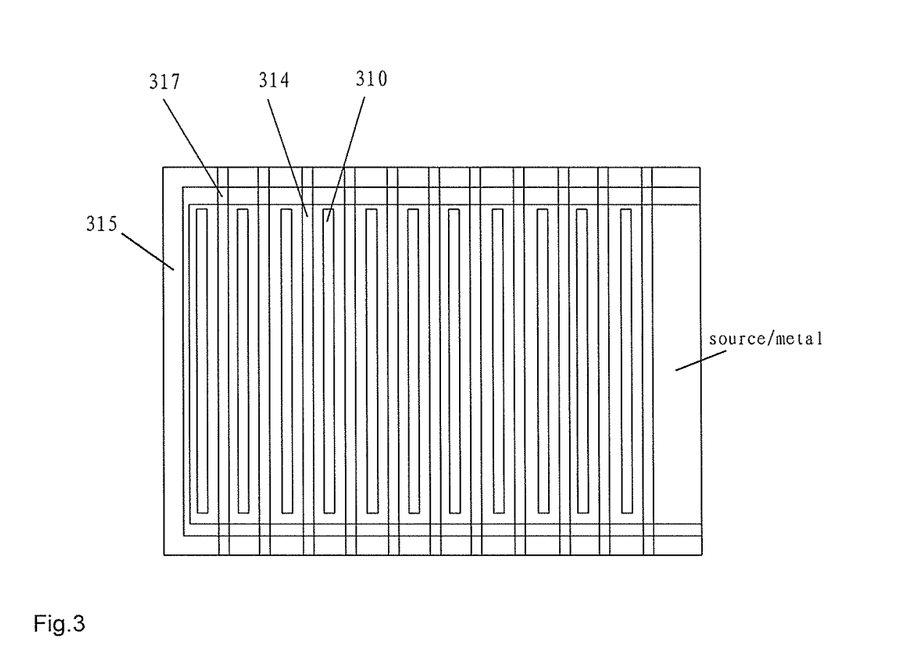
FIG. 3 is a schematic top view of a super-junction structure with stripe-shaped poly silicon gates with a surrounding metal gate ring and stripe-shaped contacts for the source connection according to the present disclosure.

A super-junction transistor having a gate formed of narrow poly silicon stripes usually has no connections between two adjacent usually parallel oriented stripes, as shown in FIG. 3, which is a schematic top view of a super-junction structure with stripe-shaped poly silicon gates 314 with a surrounding metal gate ring 315 and stripe-shaped contacts 310 for the source connection. Therefore during switching of the device, the gate potential is different between the edges of the gate stripe 314 located close and connected to a gate runner 317 usually formed of metal and the middle of each of the gate stripes 314. This means that the fraction of the gate stripe 314 located close to the gate ring 315 switches first whereas the fraction towards the middle switches with a certain delay.

It is obvious that this inhomogeneous switching get worse with a bigger chip area of the transistor. The inhomogeneous switching can lead to massive oscillations or in worst case to device destruction as only a small fraction of the transistor can carry the current.

Figure 4:
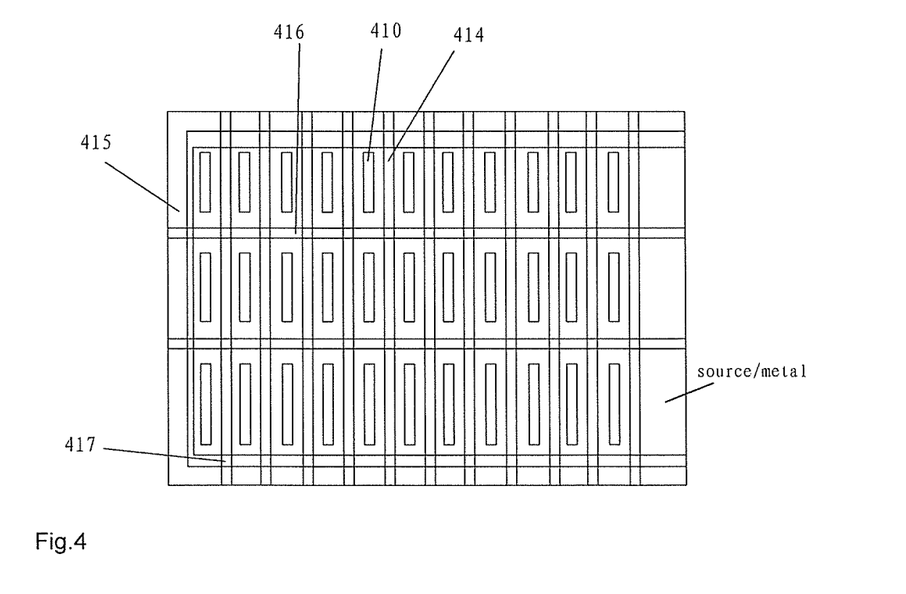
FIG. 4 is a schematic top view of a super-junction structure with stripe-shaped poly silicon gates with a surrounding metal gate ring, stripe-shaped contacts for the source connection, and one or more gate fingers according to the present disclosure.

In order to provide a more homogeneous distribution of the gate signal and thus a more homogeneous switching behavior, one or more gate fingers can be introduced, as shown in FIG. 4, which is a schematic top view of a super-junction structure with stripe-shaped poly silicon gates 414 with a surrounding metal gate ring 415, stripe-shaped contacts 410 for the source connection, and one or more gate fingers 416.

In this embodiment, the gate fingers 416 may be oriented perpendicular to the gate poly silicon stripes 414 and may be connected (but not necessarily) to the surrounding gate ring 415. The implementation of the gate fingers 416 can reduce the distributed gate resistance and improve the performance and the ruggedness of the device.

In this case, the width of the gate fingers needs to be balanced. A small structure would not be effective enough, whereas a too wide width might lead to a significant increase of the gate charge. This balancing needs to be done depending on the diffusion length adjusted by the channel diffusion process. In an embodiment of the present disclosure, the width of the gate fingers can be 10-50 μm.

As shown in FIG. 4, the gate fingers may be composed of one or more continuous stripes, and each of the continuous stripes may be connected to a gate runner 417. The stripes of the gate fingers may be parallel to each other.

In another embodiment, the gate fingers do not necessarily need to be connected to the gate runner. The concept of the gate finger generally works even without the surrounding gate ring. But it is less effective in this case. The gate fingers may also not necessarily be formed in one or more continuous stripes, but be formed in a network of several small connections, as shown in FIG. 5, which is a schematic top view of a network of small poly silicon stripes of the gate fingers of the super-junction structure.

Figure 5:
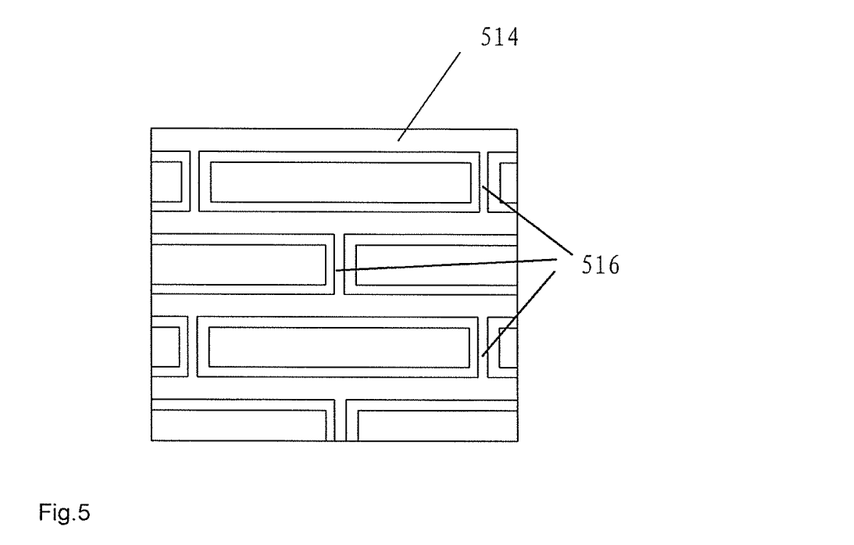
FIG. 5 is a schematic top view of a network of small poly silicon stripes of the gate fingers of the super-junction structure to ensure a more homogeneous switching behavior according to the present disclosure.

In FIG. 5, the gate finger is not continuous, and is composed of a plurality of short connections 516. Each short connection is used to electrically connect two adjacent and substantially parallel gates 514 which may be formed of poly silicon stripe. All of the short connections 516 make up a network as shown in FIG. 5, which is completely different from the plurality of parallel continuous stripes as shown in FIG. 4. By implementing the embodiment of FIG. 5, a more homogeneous switching behavior of the device can be achieved as compared to the embodiment of FIG. 4.

In the super-junction structures as shown in FIGS. 2-5, the gates are all shown to be formed of poly silicon, although all or parts of the gates may be also formed of metal. In addition, the gate fingers as shown in FIGS. 4-5 can be formed of metal or poly silicon.

Figure 6:
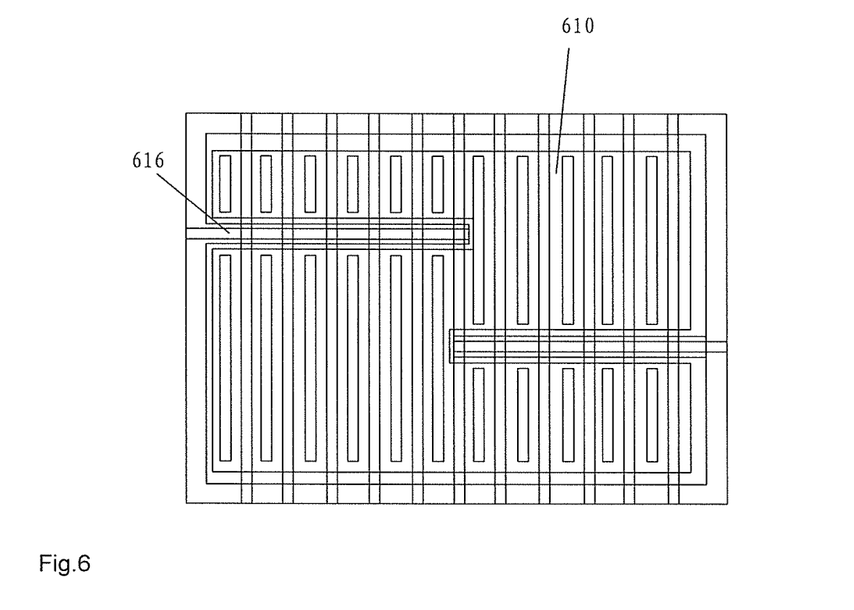
FIG. 6 is a schematic top view of a super-junction structure with stripe-shaped poly silicon gates with a surrounding metal gate ring and intermitted gate finger formed of poly silicon and metal according to the present disclosure.

FIG. 6 is a schematic top view of a super-junction structure with stripe-shaped poly silicon gates with a surrounding metal gate ring and intermitted gate finger formed of poly silicon and metal according to the present disclosure.

As shown in FIG. 6, the gate finger 616 is formed of both poly and metal. In this case, the source metallization layer 610 needs to be interrupted as shown in FIG. 6 to prevent an electrical short circuit between the gate and the source. According to the embodiment as shown in FIG. 6, one or more intermitting gate fingers 616 are utilized.

Figure 7:
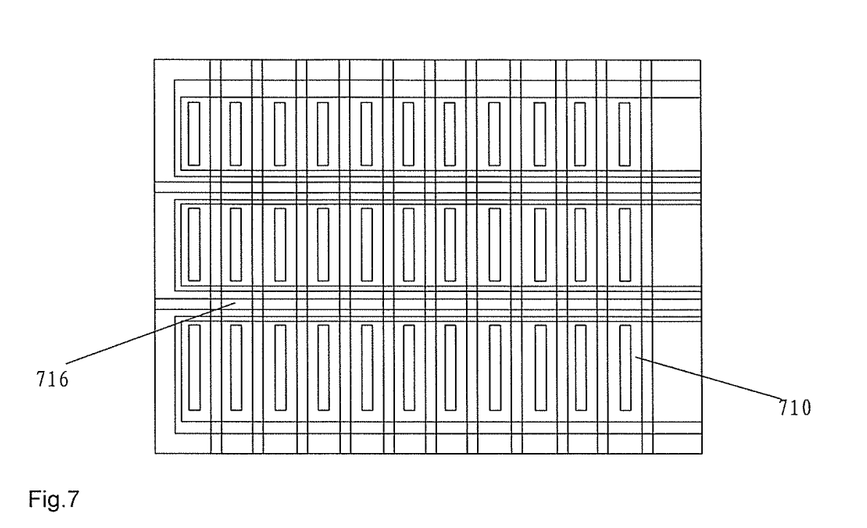
FIG. 7 is a schematic top view of a super-junction structure with stripe-shaped poly silicon gates with a surrounding metal gate ring and continuous gate fingers formed of poly silicon and metal according to the present disclosure.

FIG. 7 is a schematic top view of a super-junction structure with stripe-shaped poly silicon gates with a surrounding metal gate ring and continuous gate fingers formed of poly silicon and metal according to the present disclosure. In fact, FIG. 7 is a special embodiment of FIG. 6 with continuous fingers 716 formed of poly silicon and metal.

Since the source metallization layer 710 needs to be interrupted to prevent an electrical short circuit between the gate and the source, in this case, the chip divides into several parts with respect to the source metallization layer 710, as shown in FIG. 7, which would introduce a drawback. The drawback needs to be resolved by proper methods for the source bonding, e.g. stitch, ribbon, as this is substantially not related to the key point of the present disclosure and thus the description thereof will be omitted.

According to the present disclosure, in the super-junction structures as shown in FIGS. 2-7, the width of all of the gates in poly silicon stripe can be chosen especially to be equal to or narrower than 8 μm; and striped contacts may be utilized to electrically connect the source metallization layer and the source and body regions. In one embodiment, plug contacts instead of contact stripes may be used as the source contacts so as to electrically connect the source metallization layer and the source and body regions.

In order to realize low pitch sizes, the dimensions of the contact holes used for the source contacts need to be reduced. With a width of less than 2 pm, it is no longer possible to properly fill the contact holes by the metal sputtering processes used today without any voids. Voids could either lead to increased contact resistances and potential reliability problems. Consequently, for a further reduction of the pitch, new processes which have filling properties by using plugs out of poly silicon or Wolfram need to be introduced, as shown in FIG. 8, which schematically shows a cross section of a super-junction structure which combines the usage of a plug process for the source contact holes and an Anti-JFET-implant according to the present disclosure.

Figure 8:
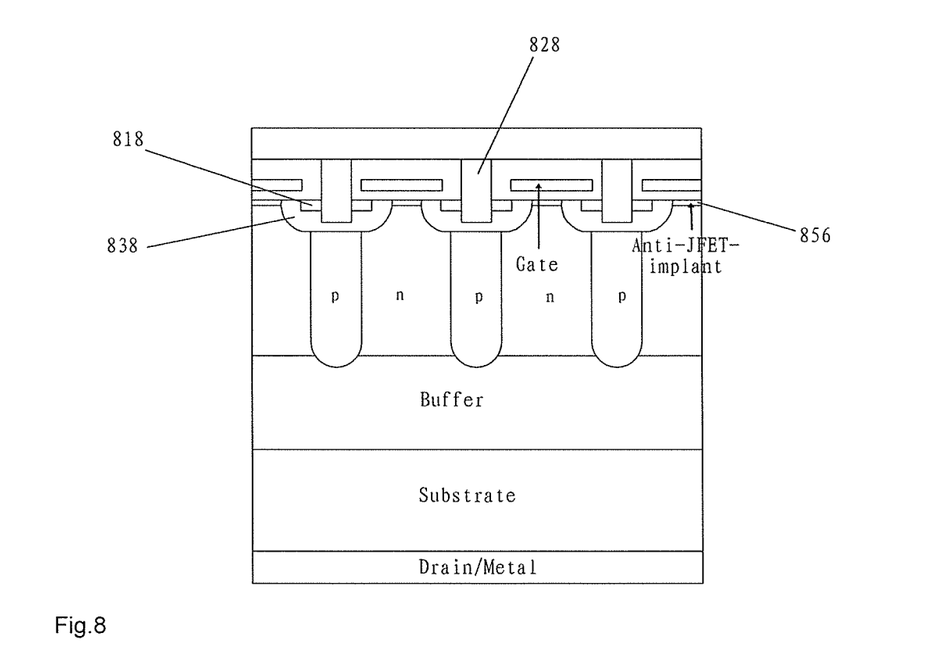
FIG. 8 schematically shows a cross section of a super-junction structure which combines the usage of a plug process for the source contact holes and an Anti-JFET-implant according to the present disclosure.

The super-junction structure 800 shown in FIG. 8 is substantially the same as the super-junction structure shown in FIG. 2, except for the plug contacts 828 used as the source contacts. That is, in FIG. 2, a conventional contact stripe is used as the source contact, whereas in FIG. 8, the plug contact is used as the source contact. For the sake of simplicity, descriptions of the parts of FIG. 8 that are the same as FIG. 2 are omitted.

Specifically, according to the present disclosure, a plug is provided, which fills a contact hole formed through an interlayer dielectric 840 between the source and body regions 818, 838 and the source metallization layer 810, to form the source plug contact 828, so as to electrically connect the source and body regions 818, 838 and the source metallization layer 810. In this embodiment, the plug contact 828 is combined with the Anti-JFET region 856 of n doping so as a further reduction of the chip size of the super-junction device can be achieved. In one embodiment, the plug contacts 828 are formed by filling the contact holes with poly silicon or wolfram.

According to one embodiment of the present disclosure, a planar gate structure is used for the gate as shown in FIGS. 2 and 8 and can be also used in the super-junction structure as shown in FIGS. 3-7.

Nevertheless, a trench gate structure may be also used for the gate instead of the planar gate structure. As an example, FIG. 9 schematically shows a cross section of embodiment of plug process with Anti-JFET-implant for a trench gate structure according to the present disclosure.

Figure 9:
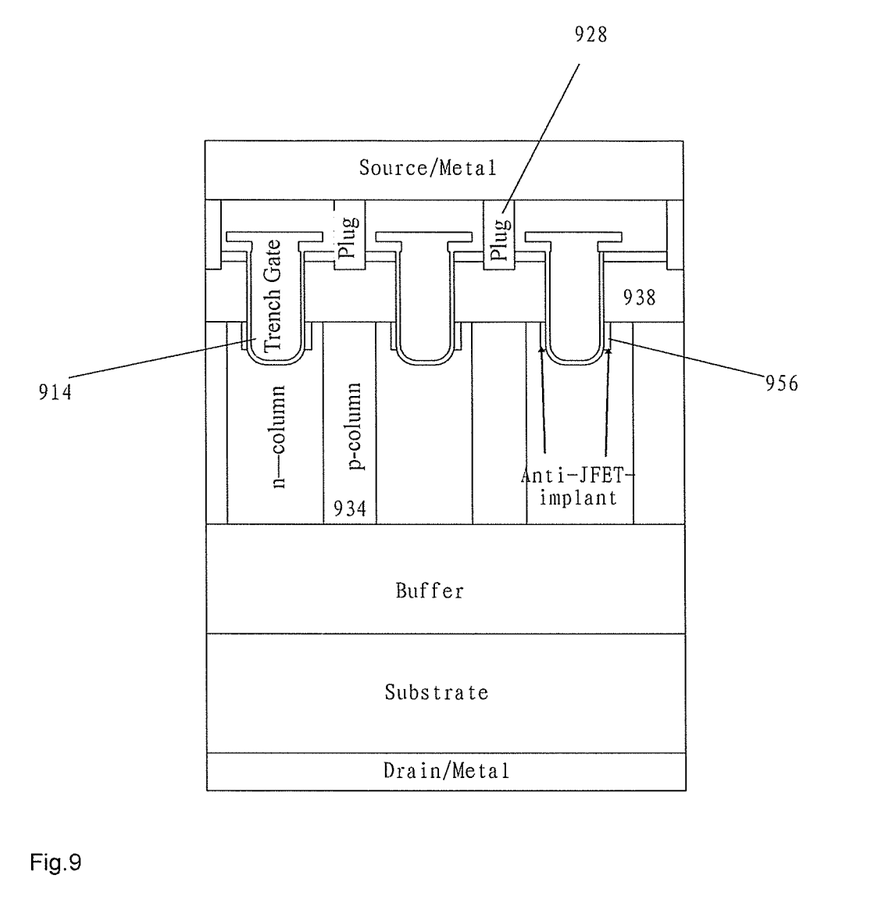
FIG. 9 schematically shows a cross section of embodiment of plug process with Anti-JFET-implant for a trench gate structure according to the present disclosure.

The super-junction structure 900 shown in FIG. 9 is substantially the same as the super-junction structure shown in FIG. 8, except for the trench gate structure 914. For the sake of simplicity, descriptions of the parts of FIG. 9 that are the same as FIG. 8 are omitted.

In FIG. 9, a gate is partially or completely formed in a trench which is formed in an n-region (n-column) 934, so as to form the trench gate structure 914. In this case, the Anti-JFET-implant region 956 is formed between the two adjacent p-body regions 938 and below them at the same time surrounding the corresponding periphery of the trench, as shown in FIG. 9. In this embodiment, a plug contact 928 formed of poly silicon or wolfram is used as the source contact.

In the above descriptions about FIGS. 2-9, in order to better highlight the present disclosure, only improved structures made in this disclosure are described in detail, while some semiconductor device structures known to those skilled in the art are only briefed or even omitted. In addition, the semiconductor device structure in the present disclosure can be formed by means of the semiconductor process well known to those skilled in the art, which will not be described in detail any more.

While the present disclosure and advantages thereof have been described in details by way of the exemplary embodiments, those skilled in the art shall understand that many substitutions and variations may be made to the present disclosure without departing from the spirit and scope of the present disclosure defined by the appended claims.

What is claimed is:

1. A semiconductor device, comprising:
   a compensation area which comprises p-regions and n-regions;
   a plurality of transistor cells on the compensation area, each of the plurality of transistor cells comprising a source region, a body region, a gate and an interlayer dielectric;
   a source metallization layer arranged on the interlayer dielectric;
   an additional n-doping region that is provided on top of the n-regions between two neighboring body regions; and
   a source plug which fills a contact hole formed through the interlayer dielectric between the source and body region and the source metallization layer, so as to electrically connect the source and body region and the source metallization layer,
   wherein the semiconductor device further comprise one or more continuous gate fingers which interrupt the source metallization layer so as to insulate the source metallization layer and the gates of the transistor cells, the continuous gate fingers being oriented perpendicular to the gates.

2. The semiconductor device according to claim 1, wherein the doping concentration of the additional n-doping region is $0.5 \times 10^{16}$ cm$^{-3}$~$5 \times 10^{16}$ cm$^{-3}$.

3. The semiconductor device according to claim 1, wherein the gate is formed of poly-silicon stripe.

4. The semiconductor device according to claim 3, wherein the semiconductor device further comprises one or more gate fingers which are oriented perpendicular to the gates, each of the gate fingers electrically connecting two neighboring gates.

5. The semiconductor device according to claim 4, wherein each of the gate fingers is formed of a continuous stripe.

6. The semiconductor device according to claim 4, wherein each of the gate fingers is formed of a non-continuous stripe.

7. The semiconductor device according to claim 5, wherein the gate finger is formed of metal or poly-silicon.

8. The semiconductor device according to claim 3, wherein the width of the stripe of the gate is equal to or narrower than 8 μm.

9. The semiconductor device according to claim 4, wherein the semiconductor device further comprises a surrounding gate ring, and the one or more gate fingers are connected to the surrounding gate ring.

10. The semiconductor device according to claim 4, wherein the width of the gate finger is 10-50 μm.

11. The semiconductor device according to claim 1, wherein the gates have a planar structure.

12. The semiconductor device according to claim 1, wherein the semiconductor device is a super-junction device.

13. A semiconductor device, comprising:
    a compensation area which comprises p-regions and n-regions;
    a plurality of transistor cells on the compensation area, each of the plurality of transistor cells comprising a source region, a body region, a gate and an interlayer dielectric;
    a source metallization layer arranged on the interlayer dielectric;
    an additional n-doping region that is provided on top of the n-regions between two neighboring body regions; and
    a source plug which fills a contact hole formed through the interlayer dielectric between the source and body region and the source metallization layer, so as to electrically connect the source and body region and the source metallization layer,
    wherein the semiconductor device further comprises one or more intermitting gate fingers which interrupt the source metallization layer so as to insulate the source metallization layer and the gates of the transistor cells, the intermitting gate fingers being oriented perpendicular to the gates.

14. The semiconductor device according to claim 13, wherein the intermitting gate finger is formed of poly-silicon and metal.

* * * * *